(12) United States Patent
Linewih et al.

(10) Patent No.: US 10,121,779 B2
(45) Date of Patent: Nov. 6, 2018

(54) INTEGRATED CIRCUITS WITH HIGH CURRENT CAPACITY AND METHODS FOR PRODUCING THE SAME

(71) Applicant: Globalfoundries Singapore Pte. Ltd., Singapore (SG)

(72) Inventors: Handoko Linewih, Singapore (SG); Chao Cheng, Singapore (SG)

(73) Assignee: Globalfoundries Singapore Pte. Ltd., Singapore (SG)

(*) Notice: Subject to any disclaimer, the term of this patent is extended or adjusted under 35 U.S.C. 154(b) by 19 days.

(21) Appl. No.: 15/376,754

(22) Filed: Dec. 13, 2016

(65) Prior Publication Data
US 2018/0166438 A1  Jun. 14, 2018

(51) Int. Cl.
*H01L 27/02* (2006.01)
*H01L 29/10* (2006.01)

(52) U.S. Cl.
CPC ...... *H01L 27/0277* (2013.01); *H01L 29/1083* (2013.01)

(58) Field of Classification Search
CPC ............. H01L 27/0277; H01L 29/1083; H01L 29/66681; H01L 27/0259
See application file for complete search history.

(56) References Cited

U.S. PATENT DOCUMENTS

| 6,093,588 A * | 7/2000 | De Petro | H01L 29/0696 257/333 |
| 7,109,558 B2 * | 9/2006 | Nakano | H01L 29/0696 257/401 |
| 8,018,000 B2 | 9/2011 | Chen et al. | |
| 9,653,450 B2 * | 5/2017 | Huang | H01L 29/7819 |
| 9,716,087 B1 * | 7/2017 | Huang | H01L 27/0262 |
| 2002/0064007 A1 * | 5/2002 | Chang | H01L 27/0255 361/56 |
| 2003/0030145 A1 * | 2/2003 | Shirai | H01L 21/28273 257/752 |
| 2007/0235809 A1 * | 10/2007 | Hayano | H01L 27/0266 257/355 |
| 2009/0166744 A1 * | 7/2009 | Kim | H01L 29/0653 257/365 |
| 2010/0117122 A1 * | 5/2010 | Benoit | H01L 21/761 257/213 |
| 2010/0133618 A1 * | 6/2010 | Hwang | H01L 27/0266 257/355 |
| 2014/0084366 A1 * | 3/2014 | Lai | H01L 29/7816 257/335 |
| 2014/0175545 A1 * | 6/2014 | Kao | H01L 29/7835 257/339 |

* cited by examiner

*Primary Examiner* — Syed Gheyas
*Assistant Examiner* — S. M. S Imtiaz
(74) *Attorney, Agent, or Firm* — Lorenz & Kopf, LLP

(57) ABSTRACT

Integrated circuits and methods of producing integrated circuits are provided. In an exemplary embodiment, an integrated circuit includes a source and a drain defined within a body isolation well. A gate overlies the body isolation well between the source and the drain, and an isolating structure is formed within the body isolation well. The isolating structure sections the source into a plurality of source sections with the plurality of source sections adjacent to one gate.

20 Claims, 11 Drawing Sheets

INTEGRATED CIRCUITS WITH HIGH CURRENT CAPACITY AND METHODS FOR PRODUCING THE SAME

TECHNICAL FIELD

The technical field generally relates to integrated circuits with high current capacities and methods of producing the same, and more particularly relates to integrated circuits with high voltage transistors that are resistant to electrostatic discharge damage and methods of producing the same.

BACKGROUND

High voltage electronic components are designed with a maximum allowed current, or a current capacity, where excessive currents above the maximum limit often damage the electronic component. High currents may result from many sources, such as operational variations, voltage and/or current fluctuations (noise), and especially electrostatic discharge (ESD) events. An ESD event is a sudden flow of electricity between two or more objects. The electrical flow can be initiated in several ways, such as electrical contact, a short, or a dielectric breakdown. The static electricity developed by walking across a carpet can be enough to damage some devices, where static electricity often has very high voltage. The high voltages associated with ESD events may produce enough current to damage or destroy one or more electronic components in an integrated circuit.

Various techniques are used to prevent electronic component damage due to ESD events. For example, manufacturers may utilize electrostatic protective areas that are essentially free of static electricity. This can involve several measures, such as avoiding the use of highly charging materials, grounding objects and/or workers, and controlling humidity. Many integrated circuits are transported in special containers that help prevent damage from ESD events, such as anti-static bags that include partially conductive plastics or other conductive materials. However, it may be difficult or impossible to prevent ESD events for integrated circuits in use. For example, an integrated circuit included in a motor vehicle is exposed to many different conditions with the motor vehicle, so prevention of ESD events is difficult. Many electronic components are designed with a current capacity, and the design features of the electronic component determine the amount of current that will damage that component. However, some designs that produce increased current capacity also increase the footprint of a component or have other undesirable attributes.

Accordingly, it is desirable to provide integrated circuits with electronic components that are capable of withstanding high electrical currents without damage, and methods of producing the same. In addition, it is desirable to provide integrated circuits with high voltage transistors that are resistant to ESD damage, and methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing integrated circuits are provided. In an exemplary embodiment, an integrated circuit includes a source and a drain defined within a body isolation well. A gate overlies the body isolation well between the source and the drain, and an isolating structure is formed within the body isolation well. The isolating structure sections the source into a plurality of source sections with the plurality of source sections adjacent to one gate.

An integrated circuit is provided in another embodiment. The integrated circuit includes an ESD transistor, where the ESD transistor includes a source and a drain defined within a body isolation well. A gate overlies the body isolation well between the source and the drain. An isolation structure formed within the body isolation well sections the drain into a plurality of drain sections such that the drain sections are in electrical communication with the source through the body isolation well. The integrated circuit also includes a power source, a ground, and a protected device, where the protected device and the ESD transistor are connected in parallel between the power source and the ground.

A method of producing an integrated circuit is provided in yet another embodiment. The method includes forming an isolating structure within a body isolation well, and forming a source within the body isolation well such that the isolating structure sections the source into a plurality of source sections. A drain is formed within the body isolation well, and a gate is formed overlying the body isolation well between the source and the drain such that one gate is adjacent to the plurality of source sections.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

Figure 1:
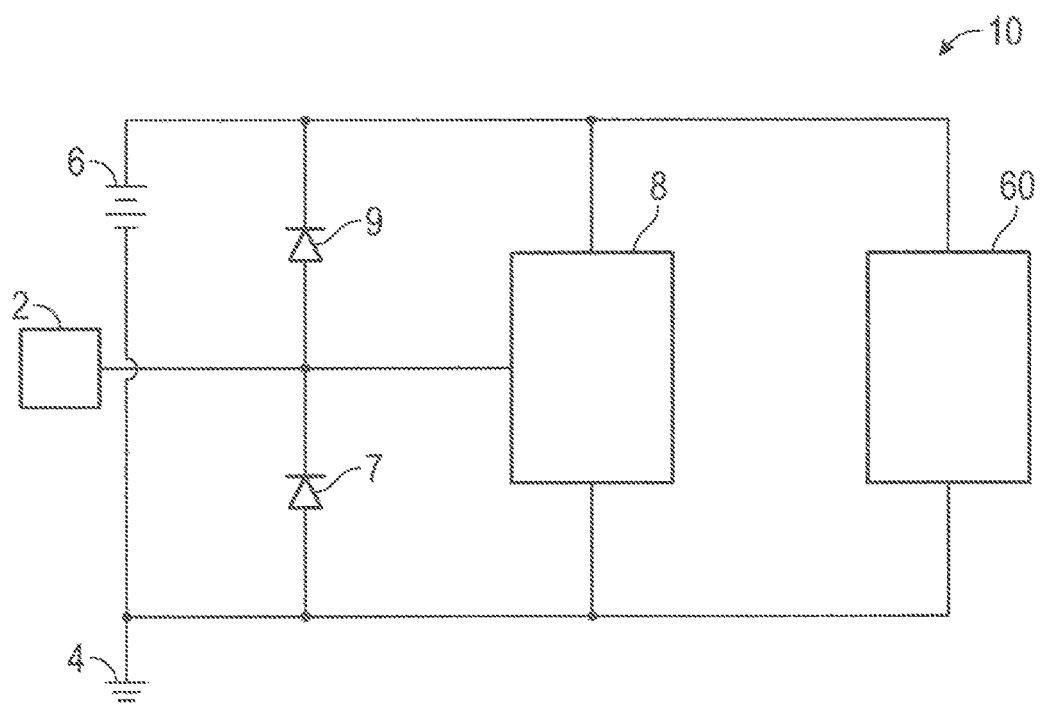
FIG. 1 is a diagram of a portion of an exemplary embodiment of an integrated circuit.

Referring to FIG. 1, an integrated circuit 10 includes a protected device 8 and an ESD transistor 60, where the ESD transistor 60 protects the protected device 8 from voltages above a protected device breakdown voltage. In exemplary embodiments, the protected device 8 may be a high voltage driver or buffer that converts an input signal voltage or drive to an output voltage that is different than the input voltage. In alternate embodiments, the protected device 8 may be an inverter, a high voltage transistor, or other types of components. The ESD transistor 60 and the protected device 8 are connected in parallel between a power source 6 and a ground 4. A signal pad 2 may also be connected to the protected device 8, where the signal pad 2 may be an input pad or an output pad in different embodiments.

The signal pad 2 may be used with the protected device 8 in the operation of the integrated circuit 10. A first diode 9 and a second diode 7 may be electrically connected to the signal pad 2, the protected device 8, and the ESD transistor 60 to help direct an unwanted electrostatic discharge away from the protected device 8. For example, an electrostatic discharge originating at the signal pad 2 may be directed through the first diode 9 to the power source 6 and/or to the line between the power source 6 and the ESD transistor 60. This electrostatic discharge may then be directed from the signal pad 2 through the first diode 9, then through the ESD transistor 60 and finally to the ground 4. An electrostatic discharge originating at the power source 6 may flow to the ESD transistor 60 and then to the ground 4. An electrostatic discharge originating at the ground 4 may flow through the second diode 7 to the signal pad 2, and/or through the ESD transistor 60 to the power source 6.

Ideally, the ESD transistor 60 will have a trigger voltage that is less than the protected device breakdown voltage, so excessive voltages from the input side will pass through the ESD transistor 60 without damaging the protected device 8. Furthermore, the ESD transistor 60 should continue to allow current flow until the voltage falls below a value that is less than the protected device breakdown voltage and higher than a protected device operating voltage. i.e., the ESD transistor 60 should not allow go into a deep "snap back," where the ESD transistor 60 activates at the trigger voltage and then rapidly de-activates or clamps while the voltage remains high. A holding voltage is a voltage where the ESD transistor 60 remains activated after being triggered, and the holding voltage is typically less than the trigger voltage. The holding voltage for the ESD transistor 60 should be greater than a protected device operating voltage so the ESD transistor 60 does not cause current leakage or otherwise interfere with normal operations of the protected device 8. Therefore, the ESD transistor 60 should "clamp shut" and block current flow when the voltage is at or less than the protected device operating voltage. Structures and methods of forming ESD transistors 60 are described more fully below.

It has been discovered that a transistor with a source and/or drain that are divided into a plurality of source and/or drain sections functioning with a single gate provides several benefits for ESD protection. Such a transistor may function by parasitic bipolar current flow, and may provide (i) increased current capacity, (ii) more sustained current flow after a triggering event, and (iii) reliable de-activing or clamping after an electrostatic event terminates. By some standards, electrostatic protection devices require a minimum specified Human Body Model (HBM) electrostatic discharge of 2 kilovolts (kV) or about 1.33 amps (according to the JEDEC electrostatic discharge standard, where JEDEC is the organization formerly known as the Joint Electron Device Engineering Council), but alternate specified limits may apply for different types of system requirements. An exemplary manufacturing process is detailed below, beginning with reference to FIG. 2. An integrated circuit 10 includes a semiconductor substrate 12, where the semiconductor substrate 12 includes semiconductor material. As referred to herein, a material that "includes" a recited element/compound includes the recited element/compound in an amount of at least 10 weight percent or more based on the total weight of the material unless otherwise indicated. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In many embodiments, the semiconductor substrate 12 primarily includes a monocrystalline silicon material. The semiconductor substrate 12 may be a bulk silicon wafer (as illustrated) or may be a layer of silicon on an insulating layer (commonly known as silicon-on-insulator or SOI, not illustrated) that, in turn, is supported by a carrier wafer. The parasitic bi-polar current flow described more fully below may require a certain depth of silicon overlying the insulating layer.

In an embodiment, a body isolation well 14 is formed by epitaxially growing the body isolation well 14 with "N" type conductivity determining impurities, where the body isolation well 14 is formed overlying the semiconductor substrate 12. The body isolation well 14 is a semiconductor material. However, it should be understood that the "N" and "P" type wells and implants described herein may be reversed in alternate embodiments. The semiconductor substrate 12 underlying the body isolation well 14 may primarily include the opposite type of conductivity determining impurity as the body isolation well 14. In an exemplary embodiment, the body isolation well 14 is grown by vapor phase epitaxy using silicon tetrachloride and hydrogen gas, but other types of epitaxy can also be used, such as molecular beam epitaxy. "N" or "P" type conductivity determining impurities are added to the source gas during the epitaxial growth, so the body isolation well 14 is formed with the desired dopant at the desired concentration. "N" type conductivity determining impurities primarily include phosphorous, arsenic, and/or antimony, but other materials can also be used. "P" type conductivity determining impurities primarily include boron, aluminum, gallium, and indium, but other materials can also be used. The body isolation well 14 may also be formed by ion implantation into the semiconductor substrate 12 in alternate embodiments.

The semiconductor substrate 12 has a lower concentration of conductivity determining impurities than in the body isolation well 14, and may have the opposite type of conductivity determining impurity than in the body isolation well 14 in some embodiments, as mentioned above. For example, in the described embodiment with a body isolation well 14 having "N" type conductivity determining impurities, the primary conductivity determining impurity in the semiconductor substrate 12 may be a "P" conductivity determining impurity. As used herein, the term "overlying" means "over" such that an intervening layer may lie between the semiconductor substrate 12 and the body isolation well 14, or "on" such that the semiconductor substrate 12 physically contacts the body isolation well 14. Moreover, the term "directly overlying" means a vertical line passing through the upper component also passes through the lower component, such that at least a portion of the upper component is directly over at least a portion of the lower component. It is understood that the integrated circuit 10 may be moved such that the relative "up" and "down" positions change, so reference to a "vertical" line means a line that is about perpendicular to a surface of the semiconductor substrate 12.

Figure 2:
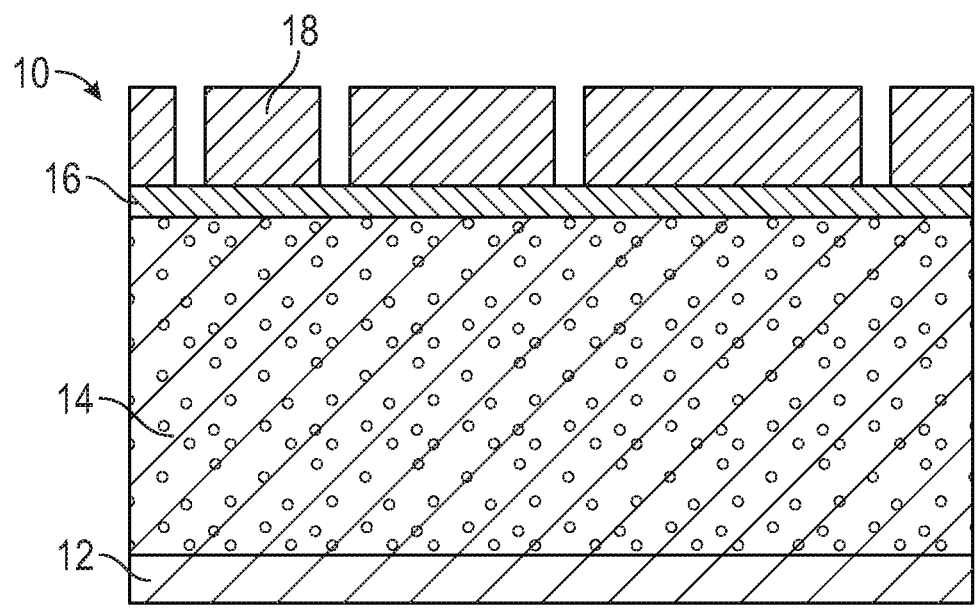
FIGS. 2, 3, and 6-13 illustrate, in cross sectional views, exemplary embodiments of an integrated circuit and methods for producing the same.

A hard mask layer 16 is formed overlying the body isolation well 14 in an exemplary embodiment, and an isolation photoresist layer 18 is formed and patterned overlying the hard mask layer 16. The isolation photoresist layer 18 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the isolation photoresist layer 18 remains overlying the other areas of the hard mask layer 16. The isolation photoresist layer 18 (and other photoresist layers described below) may optionally include a top and/or bottom anti-reflective coating and/or a hard mask (the hard mask layer 16 is illustrated in FIG. 2). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used in the hard mask layer 16, where silicon nitride can be formed by low pressure chemical vapor deposition using ammonia and dichlorosilane.

Figure 3:
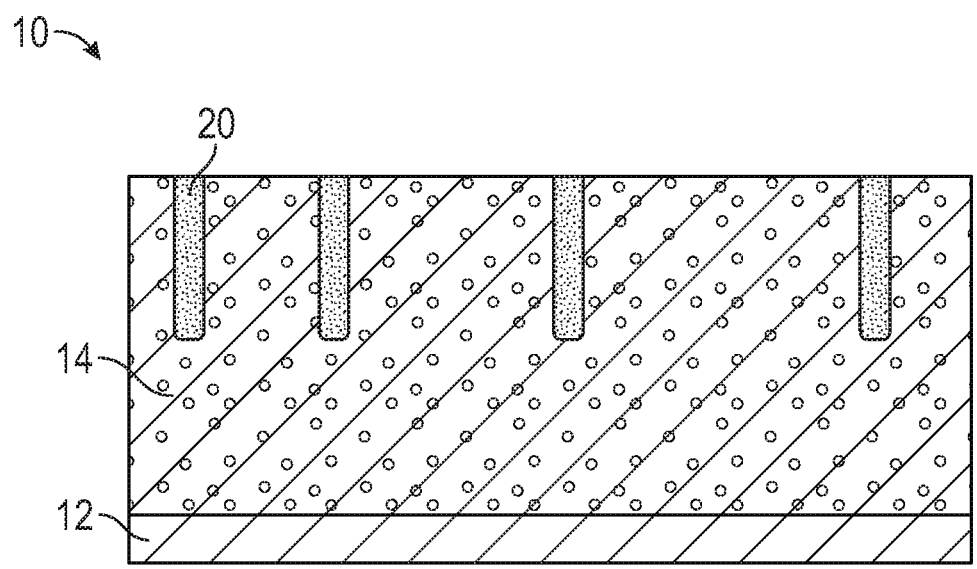

Referring to the exemplary embodiment illustrated in FIG. 3, with continuing reference to FIG. 2, isolation structures 20 are formed within the body isolation well 14. The hard mask layer 16 is patterned to match the isolation photoresist layer 18, such as with a wet etch using hot phosphoric acid, and then the isolation photoresist layer 18 can be removed, such as with an oxygen containing plasma. Trenches (not illustrated) are formed in the body isolation well 14, and filled with an electrically insulating material, such as silicon dioxide. As used herein, an "electrically insulating material" is a material with a resistivity of about $1 \times 10^4$ ohm meters or more, an "electrically conductive material" is a material with a resistivity of about $1 \times 10^{-4}$ ohm meters or less, and an "electrically semiconductive material" is a material with a resistivity of from about more than $1 \times 10^{-4}$ ohm meters to less than about $1 \times 10^4$ ohm meters. Silicon dioxide can be formed by chemical vapor deposition using silane and oxygen, but other deposition techniques, raw materials, or even electrically insulating materials may be used in alternate embodiments. Overburden from the deposition of the electrically insulating material in the isolation structures 20 can be removed, such as by chemical mechanical planarization, and the remaining hard mask layer 16 may be removed.

Figure 4:
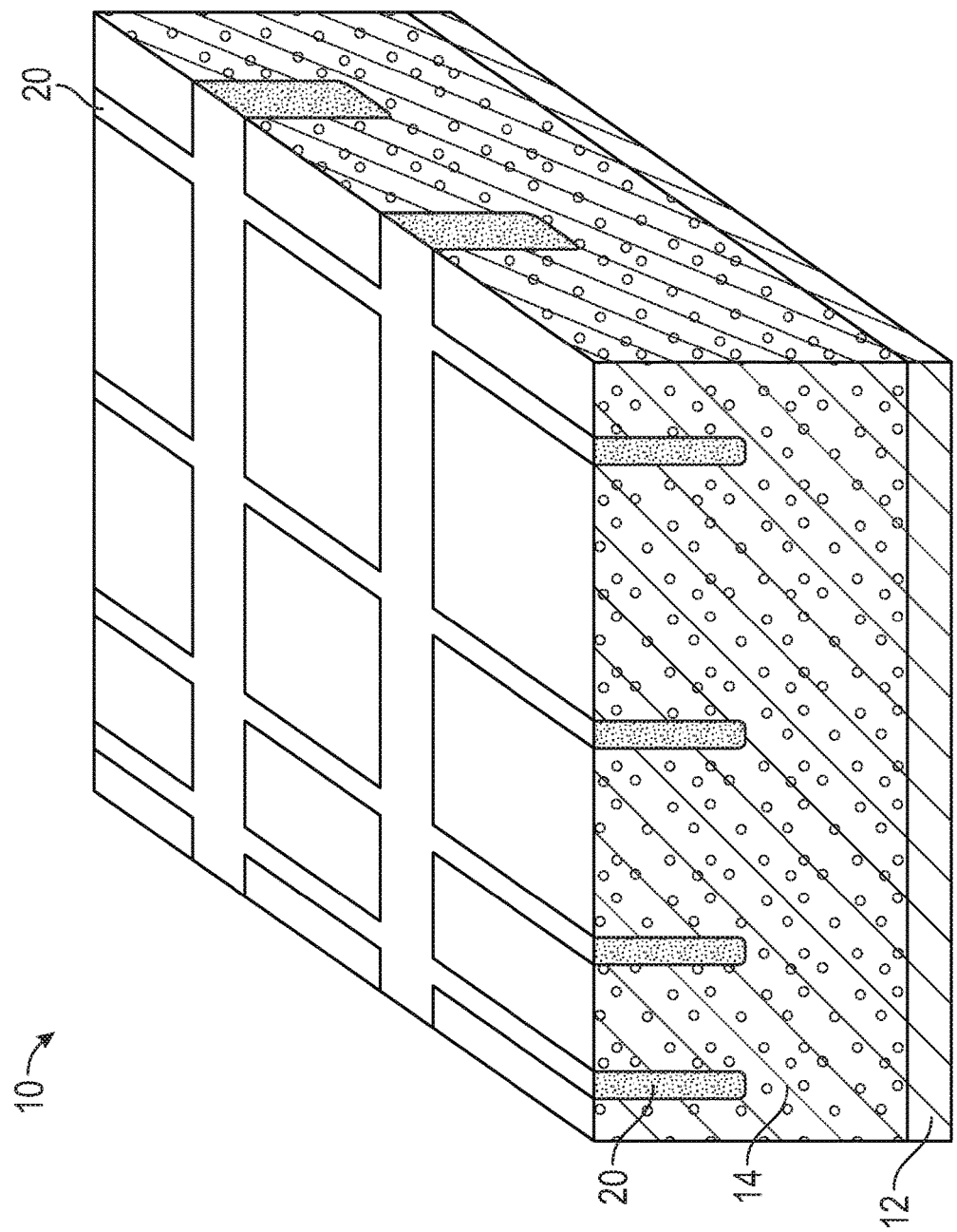
FIGS. 4 and 14 illustrate, in perspective sectional views, an integrated circuit and methods for producing the same in accordance with exemplary embodiments.

Referring to FIG. 4, the isolation structure 20 may be formed in a grid pattern, so portions of the body isolation well 14 are separated from each other at a top surface of the body isolation well 14 such that the top surface appears to have "islands" of the body isolation well 14. However, the isolation structure(s) 20 may not penetrate the body isolation well 14, so the "islands" of material from the body isolation well 14 are actually connected by portions of the body isolation well 14 that underlie the isolation structure(s) 20.

Figure 5:
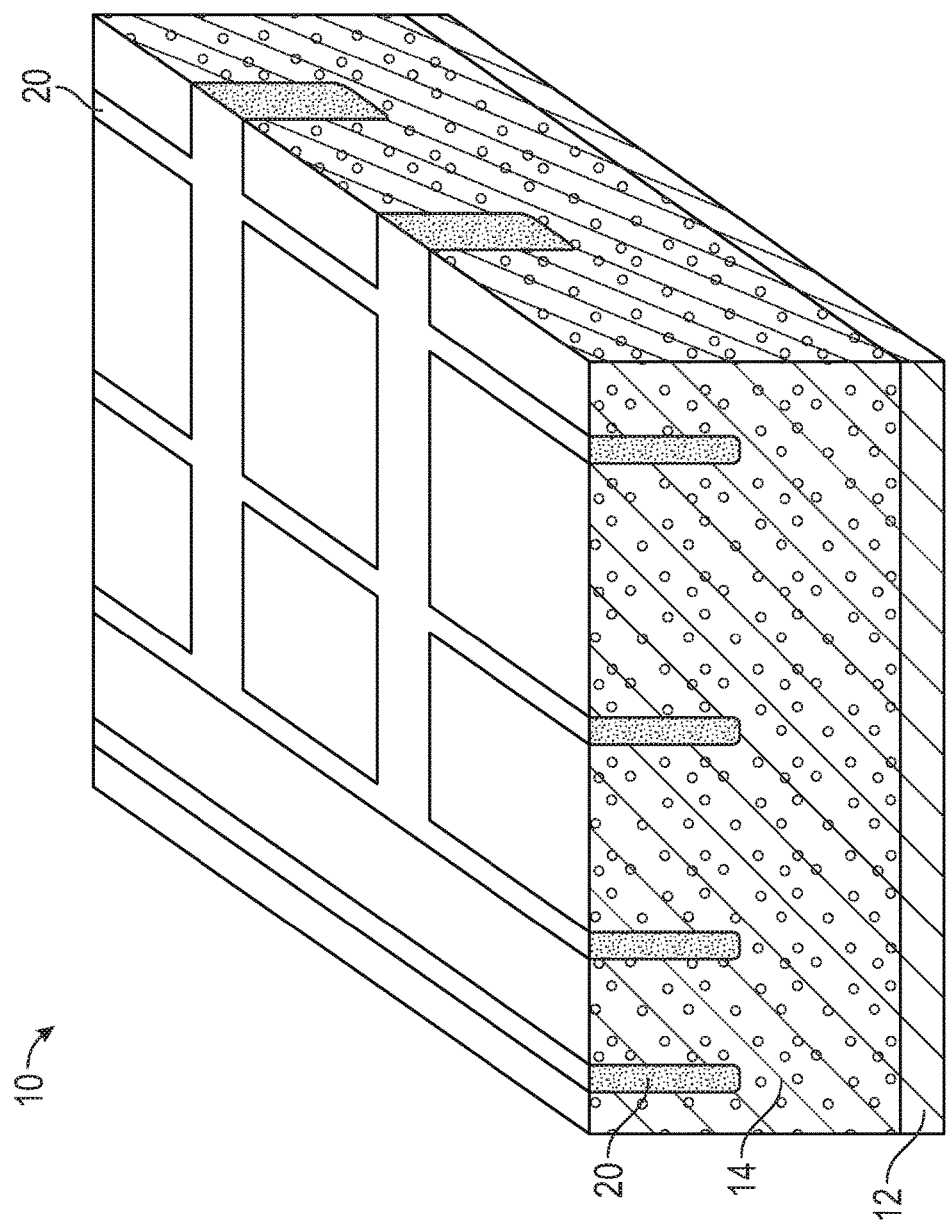
FIGS. 5 and 15 illustrate, in perspective sectional views, an alternate embodiment of an integrated circuit and methods for producing the same in accordance with exemplary embodiments.

The grid may have a different pattern than as illustrated, as described more fully below. In an exemplary embodiment, the grid includes different portions of the isolation structure 20 that are perpendicular to each other when viewed from a plan view (top view) that is perpendicular to the surface of the body isolation well 14. Shallow trench isolation structures are a type of isolating structure 20, and shallow trench isolation structures are the type of isolating structure 20 illustrated in the figures. However, other types of isolating structures 20 may be used in place of one or more of the illustrated shallow trench isolation structures in some embodiments. For example, a portion of the surface of body isolation well 14 can be exposed and oxidized to form a field oxide implant, where the field oxide implant extends into the body isolation well 14 for some distance and also extends above the body isolation well 14. Other types of isolating structures 20 may also be utilized in different embodiments, where any isolating structure 20 is an electrical insulator. FIG. 5 illustrates an alternate embodiment with a different grid pattern for the isolation structure 20. As described further below, different embodiments of the grid pattern are possible.

Figure 6:
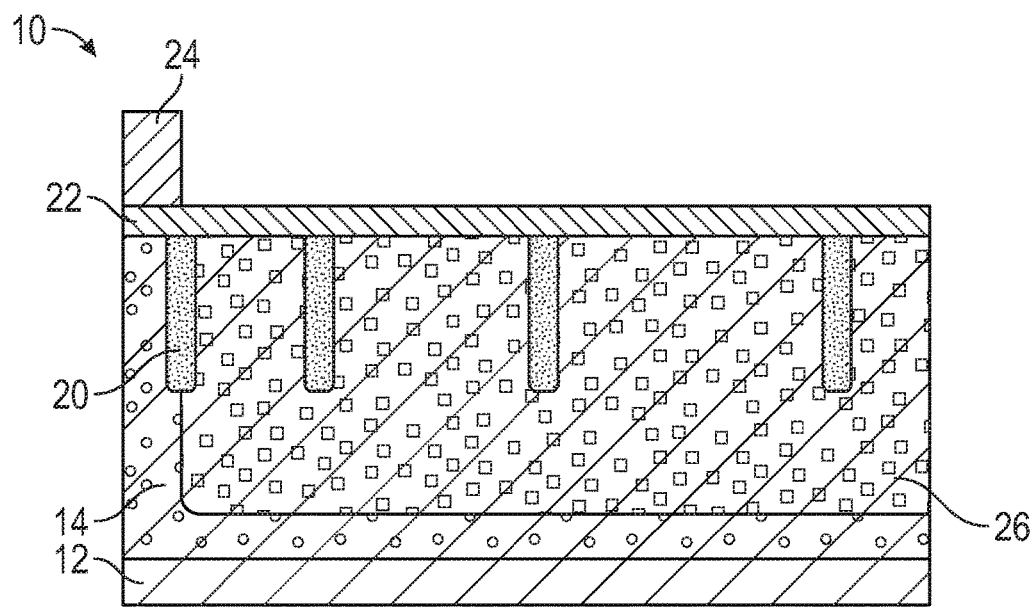

A sacrificial layer 22 is formed overlying the semiconductor substrate 12 and the body isolation well 14, as illustrated in an exemplary embodiment in FIG. 6. The sacrificial layer 22 includes an electrically insulating material such as silicon dioxide in an exemplary embodiment. The sacrificial layer 22 may be formed by chemical vapor deposition using silane and oxygen, but other deposition techniques or materials may be used and other types of electrically insulating materials may also be used in different embodiments. A base well photoresist 24 is formed and patterned overlying the sacrificial layer 22 and the semiconductor substrate 12 in an exemplary embodiment as illustrated in FIG. 6. The base well photoresist 24 is patterned to expose the body isolation well 14 is predetermined areas, and "P" type conductivity determining impurities are implanted into the body isolation well 14 such that a portion of the body isolation well 14 is formed into a base well 26. "N" type conductivity determining impurities may be implanted into the base well 26, as mentioned above, but the base well 26 is formed with the opposite type of conductivity determining impurity as that of the body isolation well 14. A portion of the body isolation well 14 underlies the base well 26, and the base well 26 may terminate underlying an isolation structure 20, such that the body isolation well 14 extends to a plane at or near a top of the isolation structure 20 on one side of the isolation structure 20, and the base well 26 extends to a plane at or near the top of the isolation structure 20 on the other side of the isolation structure 20. Electrical connections may be formed for the body isolation well 14 and the base well 26 where they extend to the plane at or near the top of the isolation structure 20, as illustrated and described below. The base well photoresist 24 may be removed after the base well 26 is formed.

Figure 7:
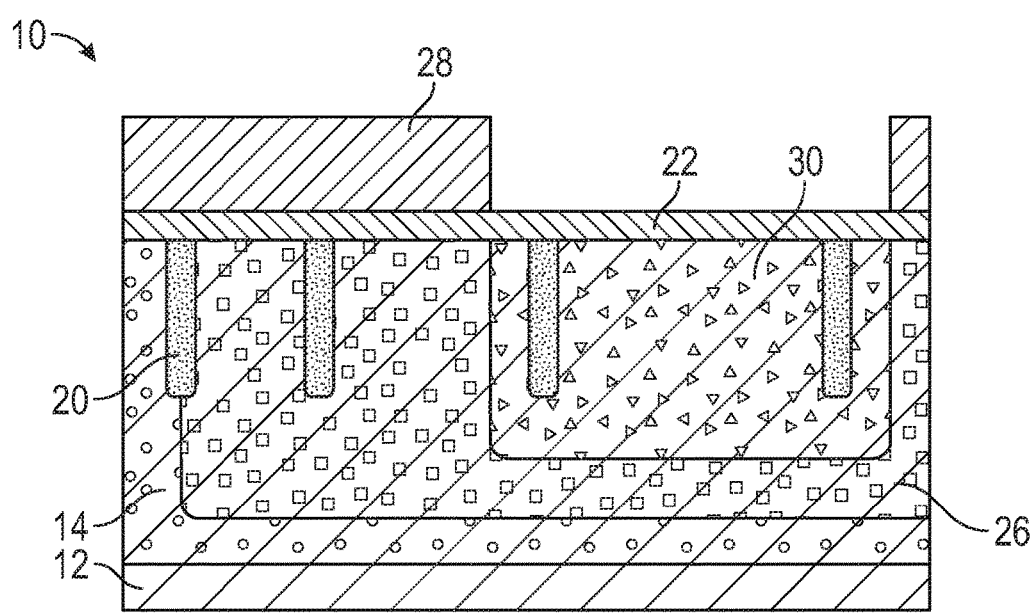
Figure 8:
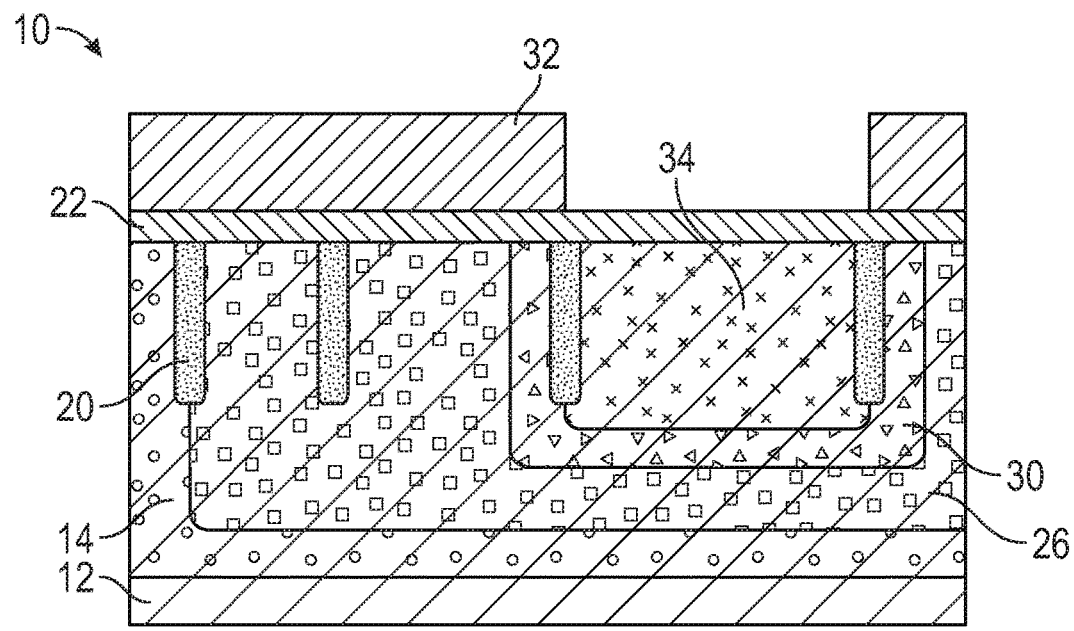

Referring to FIG. 7, an outer drain well photoresist 28 may be formed and patterned overlying the semiconductor substrate 12 and the body isolation well 14. An outer drain well 30 may then be formed within the base well 26, such as by implanting "N" type conductivity determining impurities, and the outer drain well photoresist 28 may then be removed. The outer drain well 30 primarily includes conductivity determining impurities of the opposite type as primarily present in the base well 26. An inner drain well photoresist 32 may then be formed and patterned, and an inner drain well 34 may be formed within the outer drain well 30, as illustrated in an exemplary embodiment in FIG.

8. The inner drain well 34 may include "N" type conductivity determining impurities at a higher concentration than in the outer drain well 30. The inner and outer drain wells 34, 30 primarily include the same type of conductivity determining impurity, but they may include the same or different elements of the selected type of conductivity determining impurity in some embodiments. The inner drain well photoresist 32 and the sacrificial layer 22 are removed after use. The inner and outer drain wells 34, 30 may be collectively referred to as a "drain well" herein, and a single drain well may be used in place of the inner and outer drain wells 34, 30 in some embodiments. The inner drain well 34 may be formed to tune the trigger voltage of the ESD transistor 60 (illustrated in FIG. 2), as mentioned above. The trigger voltage is tuned such that electrostatic discharge current passes by parasitic conductance through the drain well 34, 30 and the base well 26. Increasing the conductivity determining impurity concentration in the drain well 34, 30 lowers the trigger voltage.

Figure 9:
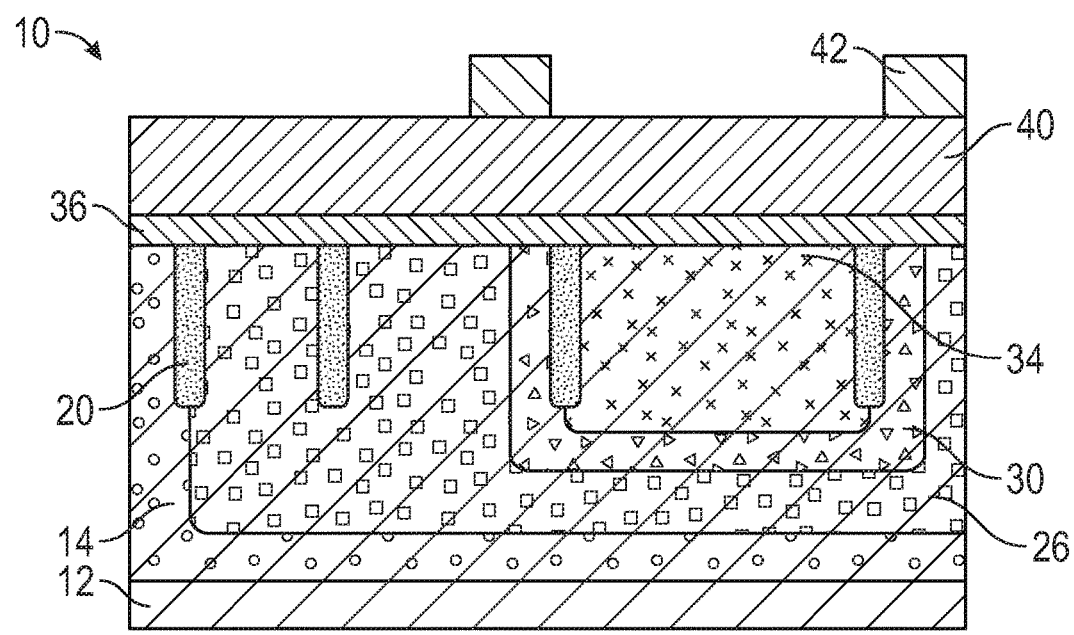

A gate dielectric layer 36 and a gate layer 40 are formed overlying the semiconductor substrate 12 and the body isolation well 14, as illustrated in FIG. 9. The gate dielectric layer 36 may be formed by thermal oxidation of silicon to produce silicone dioxide, but other types of electrically insulating materials may be formed and used in alternate embodiments. The gate layer 40 may include polysilicon in exemplary embodiments, where polysilicon can be deposited by low pressure chemical vapor deposition in a silane environment. The gate layer 40 may include conductivity determining impurities, which can be formed during the deposition of the gate layer 40 or implanted after formation. Metallic gates may be formed in alternate embodiments (not illustrated). A gate photoresist layer 42 is formed and patterned overlying the gate layer 40.

Figure 10:
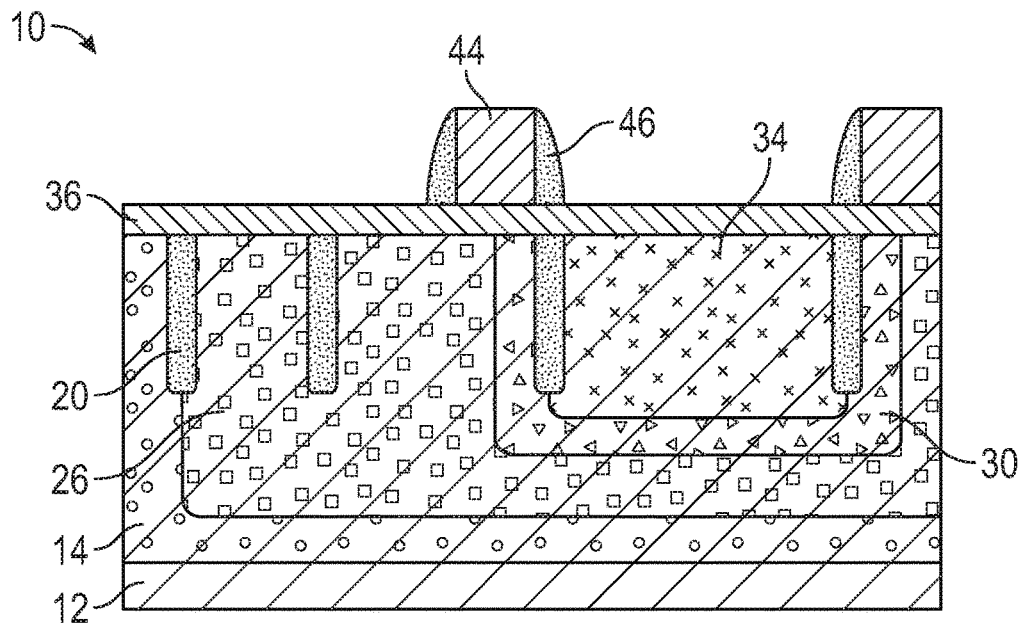

Referring to an exemplary embodiment in FIG. 10, with continuing reference to FIG. 9, a gate 44 is formed from the gate layer 40, and spacers 46 are formed adjacent to the gate 44. The gate 44 may be formed by removing the gate layer 40 from all areas except were covered by the gate photoresist layer 42 (or an associated hard mask), such as with a reactive ion etch using hydrogen bromide. The spacers 46 may be formed by blanket depositing silicon nitride followed by an anisotropic etch of the deposited silicon nitride, which leaves the vertical portions adjacent to the gate 44 in place as the spacers 46. Silicon nitride may be deposited by low pressure chemical vapor deposition using ammonia and silane, and a dry plasma etch with hydrogen and nitrogen trifluoride will anisotropically remove the silicon nitride to form the spacers 46. Other embodiments of the spacers 46 are also possible, such as spacers 46 with a plurality of layers.

Figure 11:
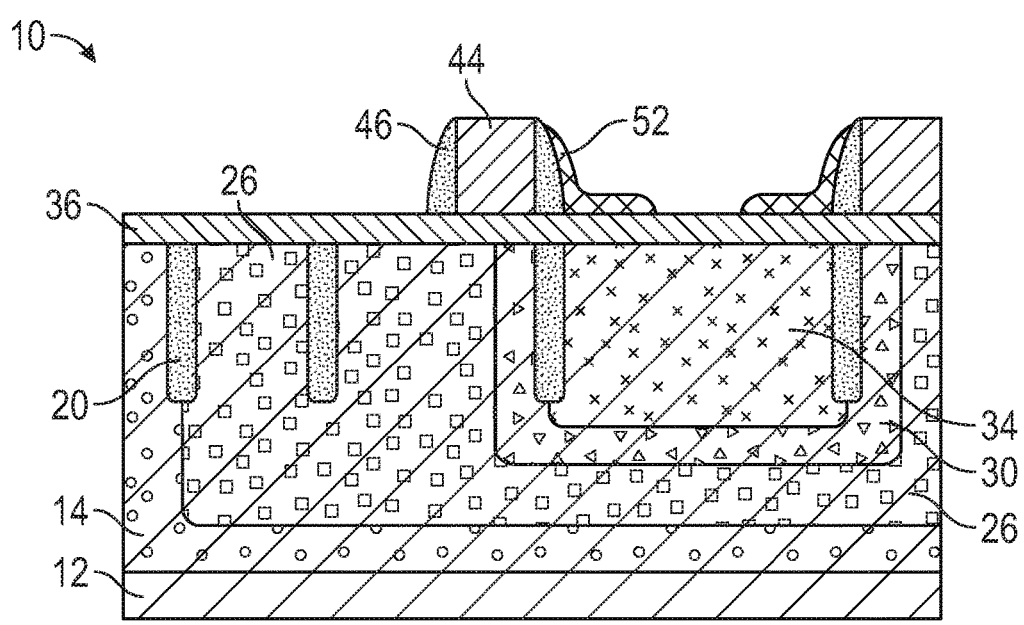

Reference is made to FIG. 11, with continuing reference to FIG. 10. A silicide block 52 may then be formed overlying a portion of the inner and outer drain wells 34, 30, and over the gate dielectric layer 36. The silicide block 52 is an electrical insulator and may include silicon nitride in some embodiments, but silicone dioxide or other electrical insulators may be used in alternate embodiments. In an exemplary embodiment, a layer of silicon nitride is deposited and removed from all undesired areas using lithography and an appropriate etchant.

Figure 12:
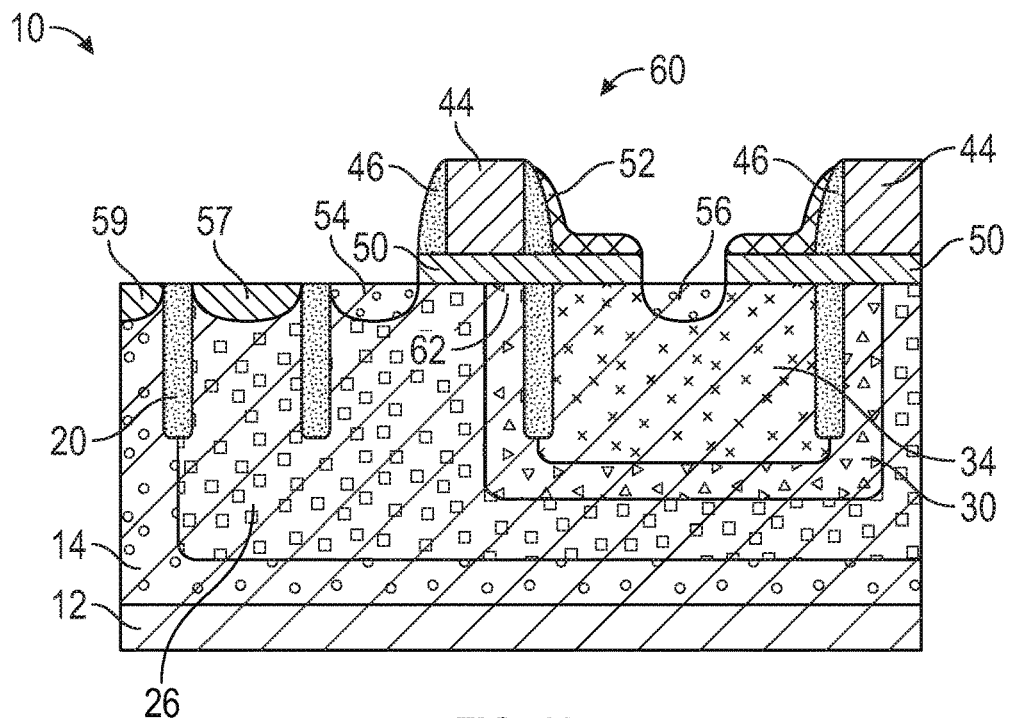

Referring to FIG. 12, a source 54 and a drain 56 are formed on opposite sides of the gate 44. In an exemplary embodiment, the source 54 and drain 56 are formed within the body isolation well 14, where the source 54 is formed within the base well 26 and the drain 56 is formed within the inner drain well 34. The source 54 and drain 56 may be formed by implanting conductivity determining impurities, such as "N" type conductivity determining impurities, where the desired areas for implantation are lithographically exposed. The source 54 and drain 56 have a higher concentration of conductivity determining impurities than the base well 26 or the inner drain well 34, respectively. A body contact implant 57 may be formed by implanting conductivity determining impurities into the base well, where the body contact implant 57 may be separated from the source 54 by an isolation structure 20. The body contact implant 57 may primarily have the opposite type of conductivity determining impurity as the source 54 and drain 56, and the body contact implant 57 is in electrical communication with the base well 26. A deep well isolation contact implant 59 may be formed within the body isolation well 14, where the deep well isolation contact implant 59 primarily includes the same type of conductivity determining impurity as the source 54 and drain 56. Lithography may be used for positioning the body contract implant 57 and the deep well isolation contact implant 59.

A gate dielectric 50 is formed from the gate dielectric layer 36 (illustrated in FIG. 11), such as by etching the gate dielectric layer 36 that is not covered by the gate 44, the spacers 46, or the silicide block 52. The silicide block 52 separates the drain 56 from the gate 44, but the source 54 may be directly adjacent to the gate dielectric 50, the gate 44, and the associated spacers 46. An isolation structure 20, such as a shallow trench isolation structure, may be formed within the body isolation well 14 between the drain 56 and the area under the gate 44. This isolation structure 20, as well as the silicide block 52 and the associated underlying inner drain well 34, increase the distance current flows from the drain 56. This increased distance may increase the current capacity of the ESD transistor 60 as compared to a transistor with no isolation structure 20 and with the drain 56 directly adjacent to the gate 44, gate dielectric 50, and associated spacers 46.

Figure 13:
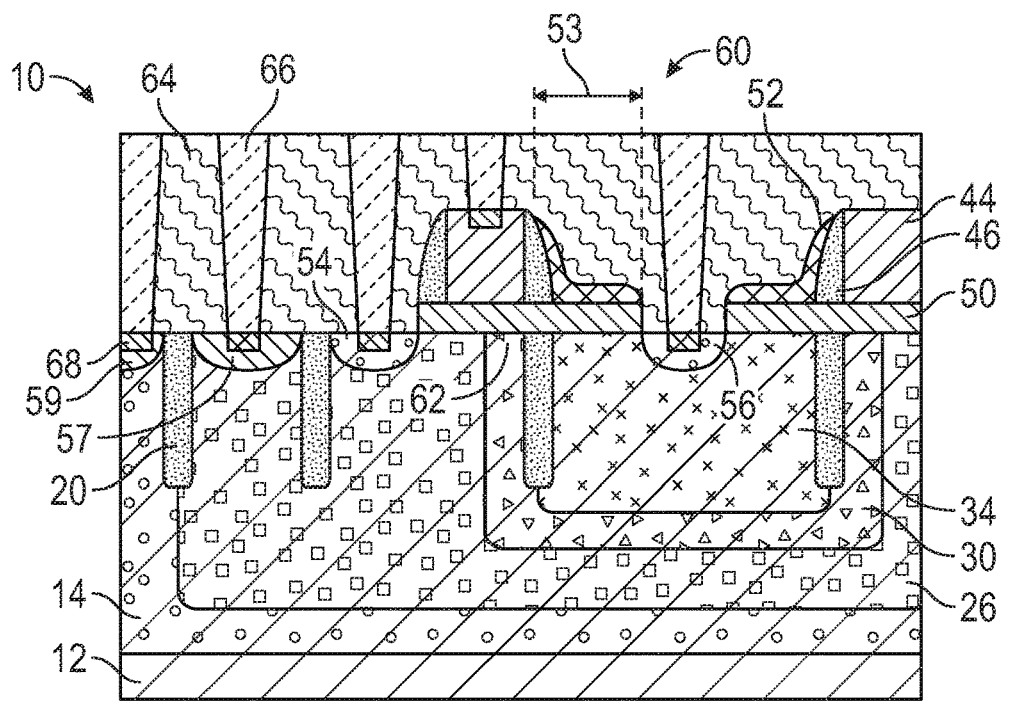

Reference is made to an exemplary embodiment in FIG. 13. An ESD transistor 60 includes the source 54, the drain 56, the gate 44, the gate dielectric 50. The source 54 and drain 56 are on opposite sides of the gate. An interlayer dielectric 64 is formed overlying the ESD transistor 60 and the semiconductor substrate 12. The interlayer dielectric 64 is an electrical insulator, and may include silicon dioxide or other electrically insulating materials. Contacts 66 are formed through the interlayer dielectric, and silicides 68 are formed at the bottom of the contacts 66 at the junction between the lower component and the contact 66 in some embodiments. In some embodiments, vias (not illustrated) are formed with lithography and an appropriate etchant, the silicides 68 are formed within the vias, and the contacts 66 are formed overlying the silicides 68 within the via. The silicides 68 may be formed by depositing a thin layer of metal on the exposed surfaces, such as by sputtering or chemical vapor deposition, and the silicide is formed by a subsequent anneal. In an exemplary embodiment, nickel (Ni) is deposited and then annealed, but other metals may be used in alternate embodiments. A wet etch may be used to selectively remove the nickel overburden that did not react with silicon to form a silicide 68. For example, nickel can be selectively etched with a mixture of nitric acid, acetic acid, and sulfuric acid. In an exemplary embodiment, the contacts 66 include an adhesion layer, a barrier layer, and a plug (not individually illustrated), which are sequentially deposited. For example, an adhesion layer of titanium is formed by low pressure chemical vapor deposition of titanium pentachloride, a barrier layer of titanium nitride is formed by chemical vapor deposition of titanium tetrabromide and ammonia, and a plug of tungsten is formed by chemical vapor deposition of tungsten hexafluoride and hydrogen. Other types of contacts are also possible, such as copper or other conductive materials, and other production techniques may also be used, such as formation of the silicides 68 prior to formation of the interlayer dielectric 64. Contacts 66 may be formed in electrical communication with the source 54, the drain 56, and the gate 44 for operation of the ESD transistor 60, and other contacts 66 may be formed in electrical communication with the body isolation well 14 and the base well 26 for grounding or biasing purposes. The body contact implant 57 may improve the electrical connection between the associated contact 66 and the base well 26, and the deep well isolation contact implant 59 improve the electrical connection between the associated contact 66 and the body isolation well 14.

Figure 14:
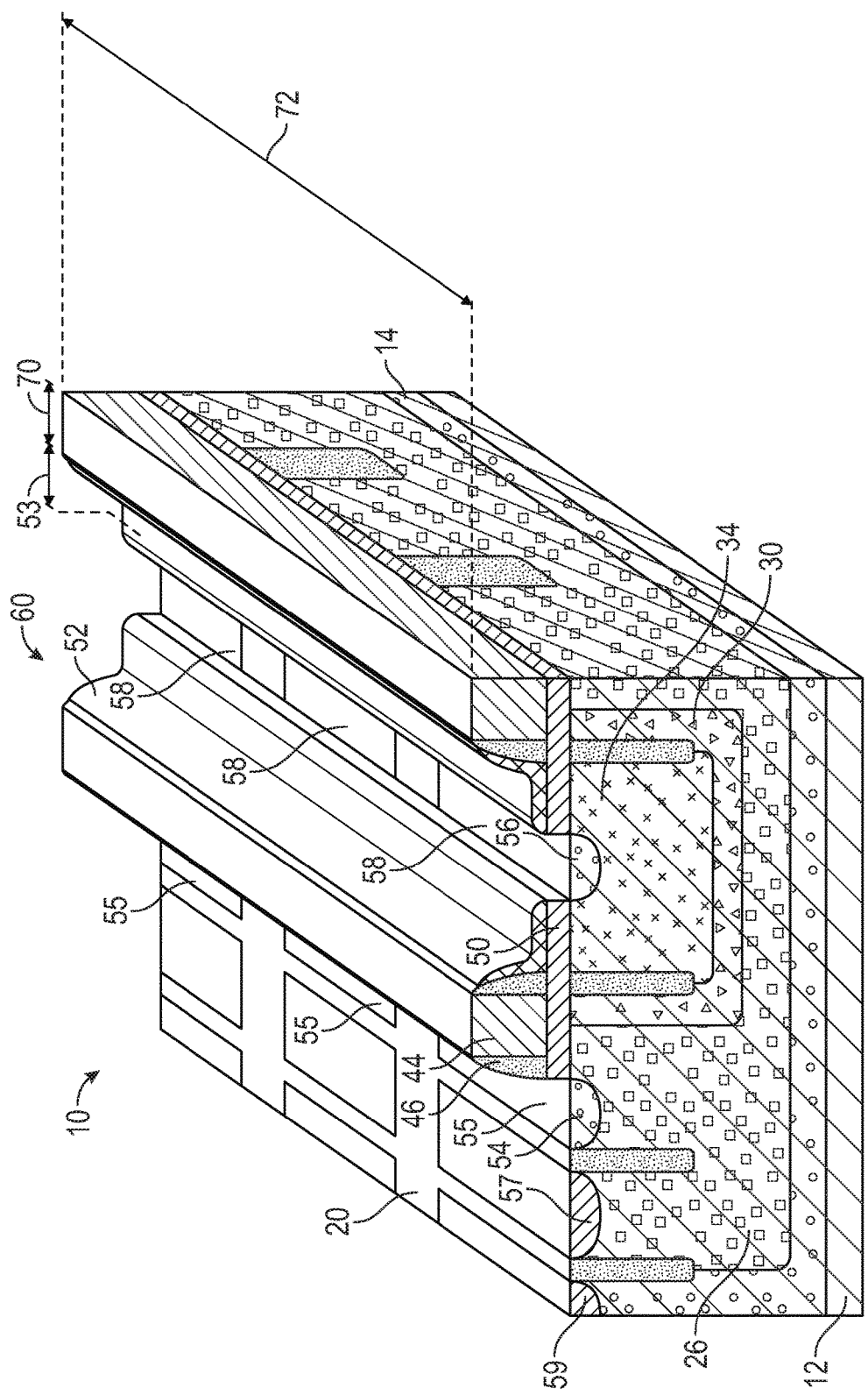

Reference is made to FIG. 14 with additional reference to FIGS. 4 and 13, where FIG. 14 illustrates the ESD transistor 60 in a sectioned perspective view prior to formation of the interlayer dielectric. As can be seen, the source 54 is divided into a plurality of source sections 55 by the isolation structures 20, where the source sections 55 are separated from each other at the surface of the body isolation well 14 by an isolation structure 20, such as a shallow trench isolation structure. In an exemplary embodiment, the source 54 is sectioned into about 10 or more source sections 55 that are associated with a single gate 44. In a similar manner, the isolation structures 20 section the drain 56 into a plurality of drain sections 58, and there may be about 10 or more drain sections 58 associated with a single gate 44 in some embodiments. The plurality of source and drain sections 55, 58 are in electrical communication with each other through the base well 26 associated with the single gate 44 that is positioned between the plurality of source sections 55 and drain sections 58. In a similar manner, individual source sections 55 are in electrical communication with other source sections 55 through the base well 26, and individual drain sections 58 are in electrical communication with other drain sections 58 through the drain well 30, 34.

It has been found that sectioning the source 54 and drain 56 into a plurality of source sections 55 and drain sections 58 in electrical communication through the channel 62 underlying a single gate 44 increases the current capacity of the ESD transistor 60, so larger electrostatic discharge events are possible without damage to the ESD transistor 60 (as compared to a transistor with one source and one drain associated with one gate). Furthermore, acceptable operating parameters are achieved with the sectioning of the source 54 and drain 56 into source sections 55 and drain sections 58 associated with a single gate 44, where the drain 56 and inner and outer drain wells 34, 30 have lower resistance than comparable ESD transistors 60 without such sectioning. The lower resistance of the drain 56 and the inner and outer drain wells 34, 30 can carry more current, which improves electrostatic discharge protection by increasing the current capacity and improving the ability to withstand high voltages without damage.

In an exemplary embodiment, the gate 44, the source 54, and the base well 26 are in electrical communication with each other and with the ground 4, as illustrated in FIG. 1. In this embodiment, the drain 56 is in electrical communication with the power source 6, which is also illustrated in FIG. 1. The term "electrical communication," as used herein, means electrical current is capable of flowing from one component to another, where the electrical current may or may not flow through an electrically conductive or semiconductive intervening component. In the embodiment described, the ESD transistor 60 is utilized as a two terminal device.

In yet another embodiment, the ESD transistor 60 with a plurality of source and/or drain sections 55, 58 may have a shorter silicide block length 53 on the drain side as compared to a ESD transistor 60 with a single source 54 and drain 56 associated with a single gate 44, and still have the same sustainable current capacity. The silicide block length 53 extends for the length of the silicide block 52 from about the drain 56 to about the gate 44. For example, an ESD transistor 60 with a plurality of source and/or drain sections 55, 58 associated with a single gate 44 may have a silicide block length 53 of from about 2 to about 3 microns with a sustainable current capacity of about 1.4 amps or greater, where a similar ESD transistor 60 with the same gate width and with a single source 54 and drain 56 associated with a single gate 44 may require a silicide block length 53 of about 4 to about 5 microns for a sustainable current capacity of about 1.4 amps or greater when activated after a triggering voltage. The reduced silicide block length 53 with comparable performance can reduce the footprint of the ESD transistor 60. The silicide block 50 serves as a resistor on the drain side that reduces the surge of energy at the gate 44 from a sudden triggering event, so the silicide block 50 serves to protect the ESD transistor 60 from damage during a triggering event.

The gate 44 has a gate length 70 and a gate width 72, where the gate length 70 is defined across the gate 44 along a line running between the source 54 and the drain 56 and the gate width 72 runs down the length of the gate 44. The gate length and width 70, 72 are perpendicular to each other. The gate 44 may overlie an isolation structure 20, as illustrated, and in some embodiments the gate 44 may overlie an isolation structure 20 for the entire gate width 72. In embodiments where the gate 44 overlies an isolation structure 20, current flows under the isolation structure 20 that underlies the gate 44 as the current flows between the drain 56 and the source 54. The isolation structures 20 that section the source 54 and drain 56 run parallel to the gate length 70. Both the source 54 and drain 56 may be sectioned into source sections 55 and drain sections 58, respectively, as illustrated and described above. However, in alternate embodiments only the source 54 may be sectioned into source sections 55, or only the drain 56 may be sectioned into drain sections 58, and the current capacity is still increased compared to comparable transistors without sectioned sources or drains.

Figure 15:
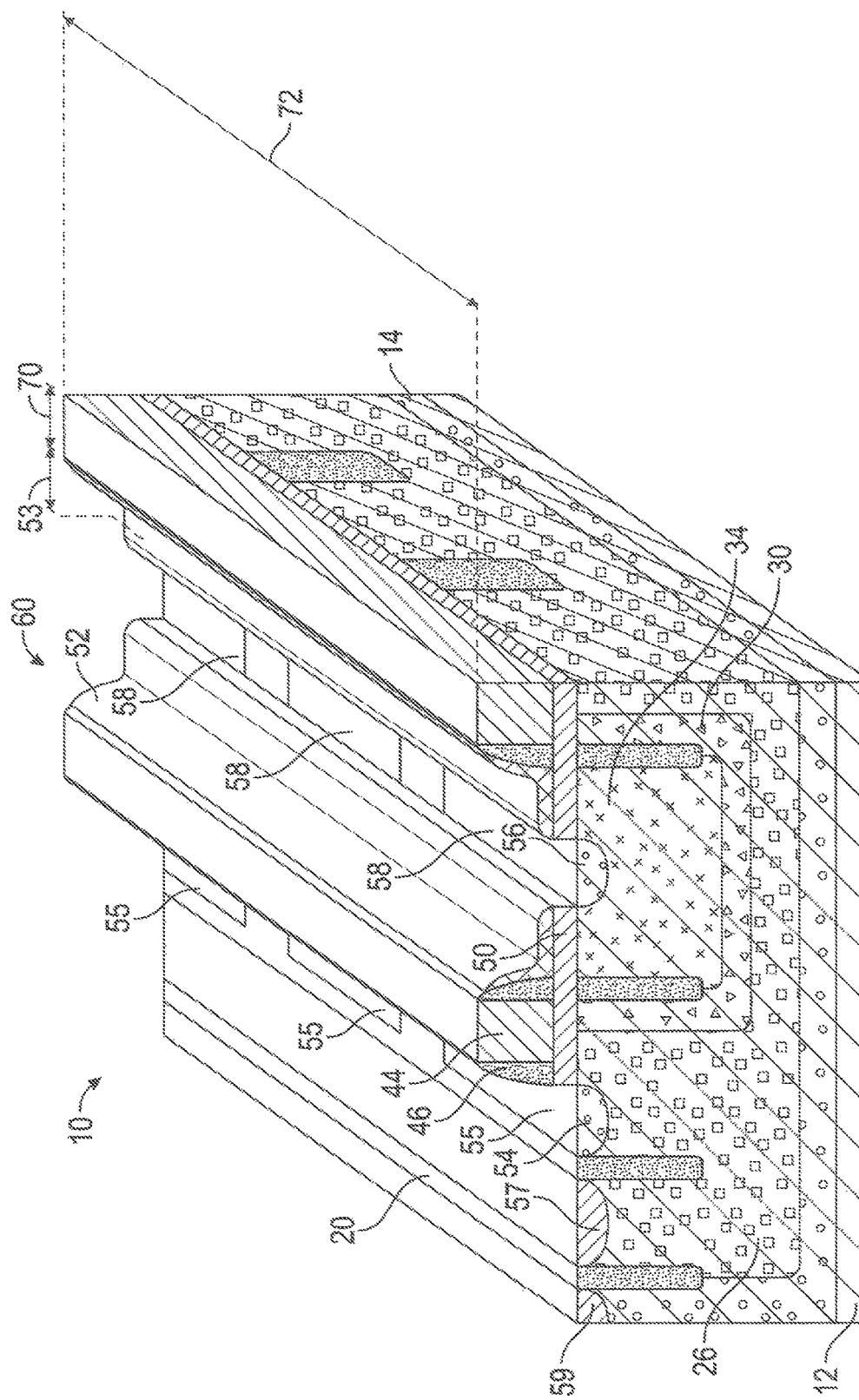

FIG. 15 illustrates an alternate embodiment of the ESD transistor 60, where the ESD transistor 60 illustrated in FIG. 15 is formed from the grid pattern of the isolation structure 20 illustrated and described in FIG. 5. Alternate grid patterns of the isolation structure 20 and associated embodiments of the ESD transistor 60 are also possible.

Figure 16:
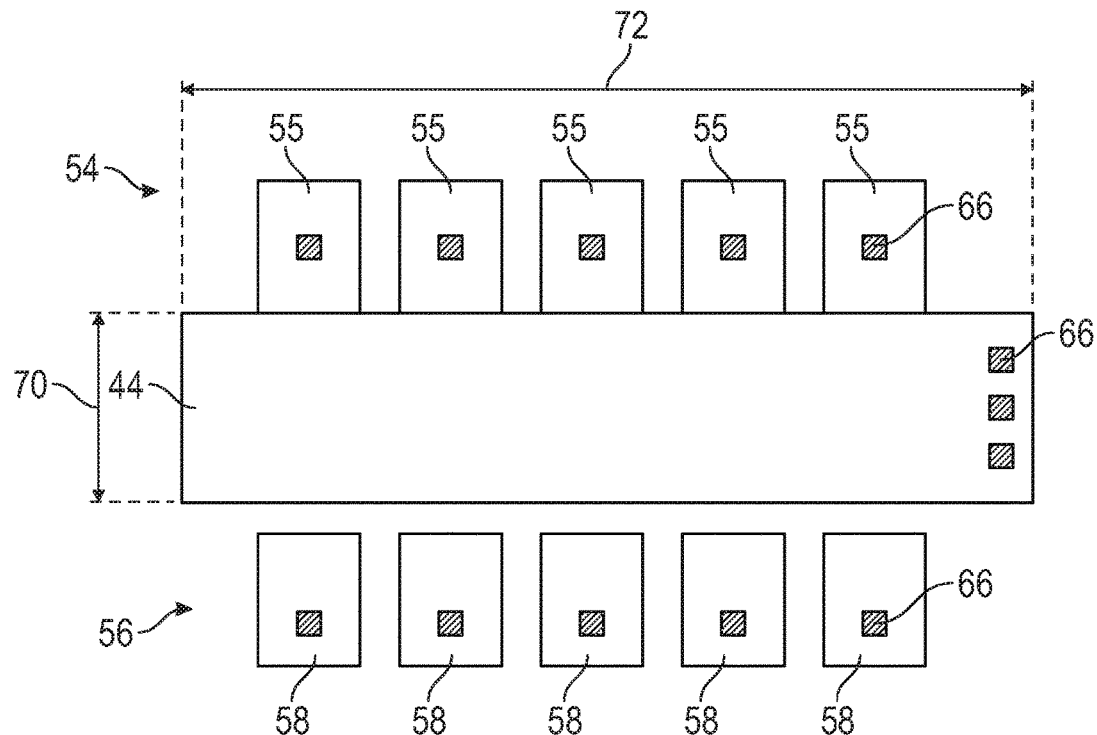
FIGS. 16 and 17 illustrate, in plan views, different configurations for portions of an integrated circuit.
Figure 17:
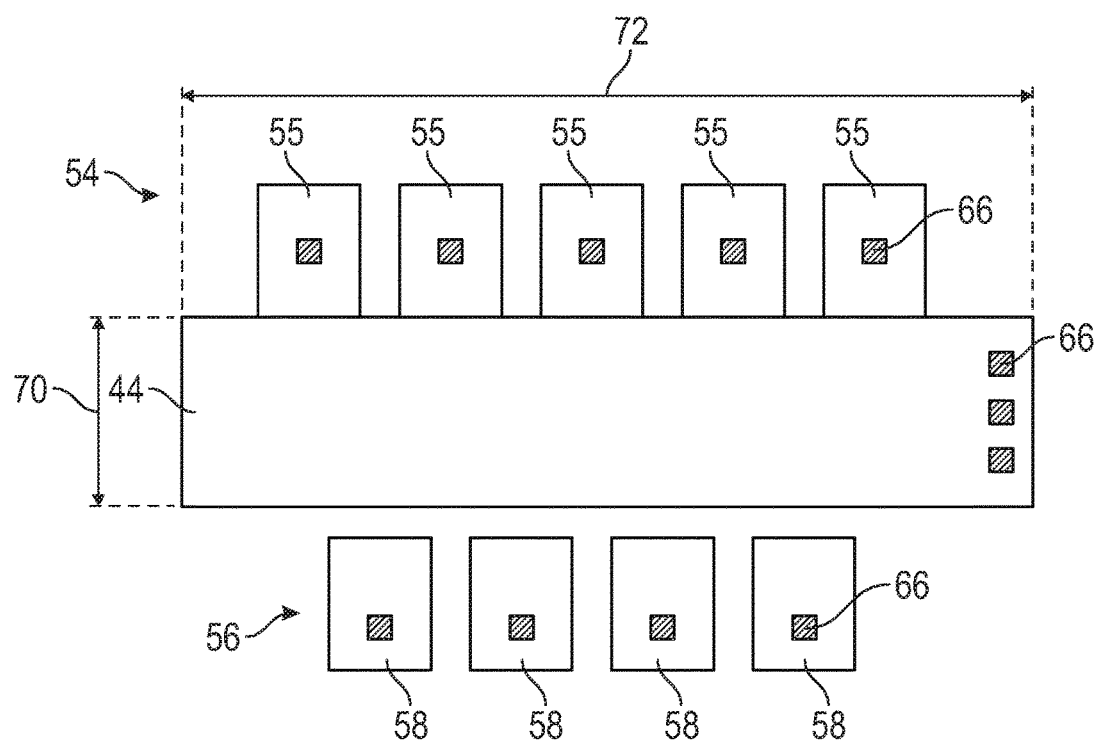

The arrangement of the source and drain sections 55, 58 may be varied in different embodiments, as illustrated in FIGS. 16 and 17 with continuing reference to FIG. 14. FIGS. 16 and 17 show different embodiments of the gate 44 (with associated contacts 66) and the source sections 55 and drain sections 58 (with associated contacts 66). As seen in FIG. 16, each of the plurality of source sections 55 is about aligned with one of the plurality of drain sections 58 along a line that is parallel to the gate length 70, where the plurality of source and drain sections 55, 58 are in electrical communication through the single channel 62 associated with a single gate 44. FIG. 17 illustrates an embodiment where each of the plurality of source sections 55 is mis-aligned with each of the plurality of drain sections 58 along a line parallel to the gate length 70, where the plurality of source and drain sections 55, 58 are in electrical communication with each other through a single channel 62 associated with a single gate 44. The production of different grid patterns for the isolation structure 20 can produce the different embodiments illustrated in FIGS. 16 and 17. As illustrated, each of the plurality of source sections 55 is directly adjacent to the gate 44, and each of the plurality of drain sections 58 is separated from the gate 44 by some distance, such as the distance created by the silicide block 52 illustrated in FIG. 12.

Reference is made to FIGS. 1, 13, and 14. In operation, the ESD transistor 60 uses parasitic conductance, so current flows from the drain 56 to the base well 26, and this current can then flow to the ground 4 through the contacts in direct electrical communication with either or both of the base well 26 and the source 54. The ESD transistor 60 is used as a two connection device, and it acts as a switch that conducts current when the voltage reaches the trigger voltage. The ESD transistor 60 continues to transfer current as long as the voltage remains high on the input side, where the high voltage is at or above the holding voltage. The ESD transistor 60 described above can be designed with a trigger voltage below the protected device breakdown voltage and an ESD transistor holding voltage above the protected device operating voltage. The ESD transistor 60 clamps shut when the voltage falls below the holding voltage, so the ESD transistor 60 does not leak current at the protected device operating voltage. The partitioning of the source 54 and/or drain 56 increases resistance and thereby reduces stress on the gate dielectric 50, and better controls the current surge during a triggering event so the ESD transistor 60 can continue to conduct current after a triggering event until the voltage falls below the holding voltage. The partitioning of the source 54 and/or drain 56 also decreases the capacitance of the ESD transistor 60 which damps the current surge during an electrostatic discharge triggering event so the ESD transistor 60 is more capable of withstand the high voltages and high currents associated with an electrostatic discharge triggering event. Furthermore, the ESD transistor 60 is configured to transfer current by parasitic conductance between the drain 56 and the base well 26, instead of through a channel underlying the gate 44 between the source 54 and drain 56. This configuration further reduces stress on the gate dielectric 50. The use of a plurality of source sections 55 and/or drain sections 58 increases the current carrying capability of the ESD transistor 60. The increased resistance from partitioning the source 54 and/or drain 56 reduces the capacitance, and facilitates the parasitic conductance that serves to protect the gate dielectric 50 from damage during an electrostatic discharge triggering event.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a source defined within a body isolation well;
   a drain defined within the body isolation well;
   a gate overlying the body isolation well between the source and the drain; and
   an isolating structure formed within the body isolation well, wherein the isolating structure sections the source into a plurality of source sections such that the plurality of source sections are adjacent to one gate, and wherein the isolating structure is electrically insulating.

2. The integrated circuit of claim 1 wherein the isolating structure underlies the gate.

3. The integrated circuit of claim 2 wherein the gate comprises a gate width, and wherein the isolating structure underlies the gate for the gate width.

4. The integrated circuit of claim 1 wherein an ESD transistor comprises the source, the drain, and the gate, and wherein the integrated circuit further comprises:
   a protected device;
   a power source; and
   a ground, wherein the ESD transistor and the protected device are connected in parallel between the power source and the ground.

5. The integrated circuit of claim 4 wherein:
   the isolating structure sections the drain into a plurality of drain sections such that the plurality of drain sections are in electrical communication with the plurality of source sections through the body isolation well;
   the gate has a gate length defined across the gate along a line between the source and the drain, and the gate has a gate width perpendicular to the gate length; and
   each of the plurality of drain sections is about aligned with one of the plurality of source sections along the line that is parallel to the gate length.

6. The integrated circuit of claim 4 wherein:
   the isolating structure sections the drain into a plurality of drain sections such that the plurality of drain sections are in electrical communication with the plurality of source sections through the body isolation well;
   the gate has a gate length defined across the gate along a line between the source and the drain, and the gate has a gate width perpendicular to the gate length; and
   each of the plurality of drain sections is mis-aligned with each of the plurality of source sections along the line that is parallel to the gate length.

7. The integrated circuit of claim 1 further comprising:
   a silicide block overlying the body isolation well, wherein the silicide block is positioned between the drain and the gate.

8. The integrated circuit of claim 7 wherein:
   the silicide block comprises a silicide block length of from about 2 to about 3 microns, wherein the silicide block length extends from about the drain to about the gate; and
   wherein an ESD transistor includes the source, the drain, and the gate, and wherein the ESD transistor has a current capacity of about 1.4 amps or more measured according to the JEDEC electrostatic discharge standard.

9. The integrated circuit of claim 1 further comprising:
   a drain well defined within the body isolation well underlying the drain, wherein the drain well comprises "N" type conductivity determining impurities; and
   a base well defined within the body isolation well underlying the drain well.

10. The integrated circuit of claim 9 wherein:
    the drain, the base well, and the source are in electrical communication.

11. The integrated circuit of claim 1 wherein the isolating structure comprises a shallow trench isolation structure.

12. The integrated circuit of claim 1 wherein the plurality of source sections comprise about 10 source sections or more.

13. The integrated circuit of claim 1 further comprising: a base well underlying the plurality of source sections, wherein the plurality of source sections are in electrical communication with each other through the base well.

14. An integrated circuit comprising: an ESD transistor, wherein the ESD transistor comprises; a source defined within a body isolation well; a drain defined within the body isolation well; a gate overlying the body isolation well between the source and the drain; and an isolation structure formed within the body isolation well, wherein the isolation structure sections the drain into a plurality of drain sections such that the plurality of drain sections are in electrical communication with the source through the body isolation well, the plurality of drain sections are equidistant from one gate, and wherein the isolation structure is electrically insulating; and a power source; a ground; and a protected device, wherein the protected device and the ESD transistor are connected in parallel between the power source and the ground.

15. The integrated circuit of claim 14 further comprising:
a drain well defined within the body isolation well underlying the drain; and
a base well defined within the body isolation well underlying the drain well such that electrical communication between the source and the drain comprises electrical communication through the drain well and through the base well.

16. The integrated circuit of claim 14 further comprising:
A silicide block overlying the body isolation well between the drain and the gate.

17. The integrated circuit of claim 16 wherein:
the silicide block comprises a silicide block length of from about 2 to about 3 microns, wherein the silicide block length extends from about the drain to about the gate; and
wherein the ESD transistor has a current capacity of about 1.4 amps or greater measured according to the JEDEC electrostatic discharge standard.

18. The integrated circuit of claim 14 wherein:
the isolation structure sections the source into a plurality of source sections.

19. The integrated circuit of claim 14 wherein the plurality of drain sections comprise about 10 or more drain sections.

20. A method of producing an integrated circuit comprising:
forming an isolating structure within a body isolation well, wherein the isolation structure is electrically insulating;
forming a source within the body isolation well, wherein the source is formed such that the isolating structure sections the source into a plurality of source sections;
forming a drain within the body isolation well;
forming a gate overlying body isolation well between the source and the drain, wherein the gate is formed such that one gate is adjacent to the plurality of source sections.

* * * * *